United States Patent
Lin et al.

(10) Patent No.: US 7,253,093 B2
(45) Date of Patent: Aug. 7, 2007

(54) METHOD FOR FABRICATING INTERCONNECTION IN AN INSULATING LAYER ON A WAFER

(75) Inventors: Steven G S Lin, Hsinchu County (TW); Su-Ping Chiu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 292 days.

(21) Appl. No.: 10/906,168

(22) Filed: Feb. 5, 2005

(65) Prior Publication Data

US 2006/0178001 A1      Aug. 10, 2006

(51) Int. Cl.
*H01L 21/30* (2006.01)
(52) U.S. Cl. .................. 438/618; 257/E21.575
(58) Field of Classification Search ........ 257/E21.575, 257/E23.145, E23.164; 438/618
See application file for complete search history.

(56) References Cited

U.S. PATENT DOCUMENTS 4,900,695 A * 2/1990 Takahashi et al. .......... 438/625
5,328,553 A * 7/1994 Poon ........................... 438/633
2002/0070453 A1* 6/2002 Yamamoto .................. 257/758

* cited by examiner

*Primary Examiner*—Asok Kumar Sarkar
(74) *Attorney, Agent, or Firm*—Jiang Chyun IP Office

(57) ABSTRACT

A method for fabricating an interconnection in an insulating layer on a wafer is described. A wafer having a plurality of conductive lines thereon is provided. An insulating layer is formed over the conductive lines. Two via holes are formed in the insulating layer to expose two of the conductive lines waiting to be repaired. A first conductive layer is filled into the via holes to form two pattern marks. A mask is formed over the wafer to cover the insulating layer and the two pattern marks. The mask located above and between the two pattern marks is removed to form a trench exposing the two pattern marks and a portion of the insulating layer. A second conductive layer is formed over the mask to cover the two exposed pattern marks and the exposed insulating layer. The mask and the second conductive layer above the mask are removed simultaneously.

13 Claims, 7 Drawing Sheets

METHOD FOR FABRICATING INTERCONNECTION IN AN INSULATING LAYER ON A WAFER

BACKGROUND OF THE INVENTION

1. Field of the Invention

The present invention relates to a semiconductor process. More particularly, the present invention relates to a method of fabricating an interconnection in an insulating layer on a wafer and a structure thereof.

2. Description of the Related Art

Integrated circuit fabrication is a high-tech industry that involves four major subsystems including integrated circuit design, wafer manufacturing, wafer testing and wafer packaging. After all the steps necessary for fabricating a complete integrated circuit have been completed, a series of tests is carried out to ensure the quality of the final products and/or to modify the circuit fabrication process according to the test results. Furthermore, at the end of a wafer fabrication cycle, the wafer frequency undergoes many types of wafer tests. If defects or out-of-spec elements are found in the circuit on the wafer, a repair operation is often carried out to form a repair circuit. This kind of operational mode not only saves the trouble of producing rework photomask and some other costs, but also significantly increases overall yield of the wafer.

In 1988, Intel's researcher Richard Leven-good uses a focused ion beam (FIB) device to 'deposit' a section of absent circuit on a microprocessor chip. Thereafter, the chip is tested and found to operate normally. From that time on, FIB has become one of the principal techniques for repairing defective circuits or out-of-spec circuits of a silicon wafer. However, there are a still a few drawbacks in using the FIB technique to repair wafer circuits. Because a FIB device is an expensive piece of equipment, using the FIB technique to repair circuits on the wafer separated by a long distance is rather expensive. Furthermore, it takes considerable time to repair each stretch of circuit using the FIB technique. The repairing time is even longer if the circuits to be repaired are separated by a long distance.

SUMMARY OF THE INVENTION

Accordingly, at least one objective of the present invention is to provide a method for fabricating an interconnection in an insulating layer on a wafer capable of repairing circuits on the wafer and reducing the repairing cost.

At least a second objective of the present invention is to provide an interconnection in an insulating layer on a wafer for removing defective or out-of-spec circuits that lead to a drop in the production yield of the wafer.

To achieve these and other advantages and in accordance with the purpose of the invention, as embodied and broadly described herein, the invention provides a method for fabricating an interconnection in an insulating layer on a wafer. First, a wafer having a plurality of conductive lines thereon is provided, and an insulating layer has been formed over the conductive lines. Two via holes are formed in the insulating layer to expose two of the conductive lines. Thereafter, a first conductive layer is filled into the via holes to form two pattern marks. A mask is formed over the wafer to cover the insulating layer and the two pattern marks. The mask located above and between the two pattern marks is removed to form a trench exposing the two pattern marks and a portion of the insulating layer. A second conductive layer is formed over the mask to cover the two exposed pattern marks and the exposed insulating layer. The mask and the second conductive layer above the mask are removed simultaneously.

According to one preferred embodiment of the present invention, the mask is fabricated using silicon oxide and the silicon oxide mask over the wafer is formed in a spin coating operation. Furthermore, the mask can also be fabricated using other materials including titanium dioxide, acetic acid resin or silicone.

According to one preferred embodiment of the present invention, the process of removing the mask above and between the two pattern marks to form the trench includes cutting out an area on the mask and removing the mask within the cutout area. The cutout area is formed on the mask by using focused ion beam technique or laser technology.

According to one preferred embodiment of the present invention, the first conductive layer is selected from a group consisting of tungsten, platinum, gold, copper, aluminum and a combination thereof.

According to one preferred embodiment of the present invention, the via holes are formed in the insulating layer by using focused ion beam technique or laser technology.

According to one preferred embodiment of the present invention, the second conductive layer is selected from a group consisting of tungsten, platinum, gold, copper, aluminum and a combination thereof.

According to one preferred embodiment of the present invention, the second conductive layer is formed in a sputtering or an electroplating operation.

According to one preferred embodiment of the present invention, the insulating layer is a passivation layer. According to one preferred embodiment of the present invention, the insulating layer is fabricated using silicon nitride or silicon oxide.

The present invention also provides an interconnection in an insulating layer on a wafer. This structure comprises a wafer, an insulating layer, two pattern marks and a conductive layer. The wafer has a plurality of conductive lines thereon. The insulating layer is disposed on the wafer to cover the conductive lines. The insulating layer has two via holes that expose two of the conductive lines. The two pattern marks are disposed inside the via holes and in electrical contact with the two conductive lines respectively. The top surface of the two pattern marks is at a level higher than the top surface of the insulating layer. The conductive layer covers at least the top surface of the two pattern marks and the insulating layer between the two pattern marks for electrically connecting the two conductive lines.

Accordingly, the method for fabricating an interconnection in an insulating layer on a wafer in the present invention does not use the focused ion beam technique to form the interconnection in the insulating layer directly. Therefore, the method of the present invention demands a shorter repairing cycle and a lower cost than the conventional FIB technique especially for repairing circuits separated by a long distance. Since considerable time is saved in fabricating the interconnection in the insulating layer on the wafer, throughput of the wafer is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
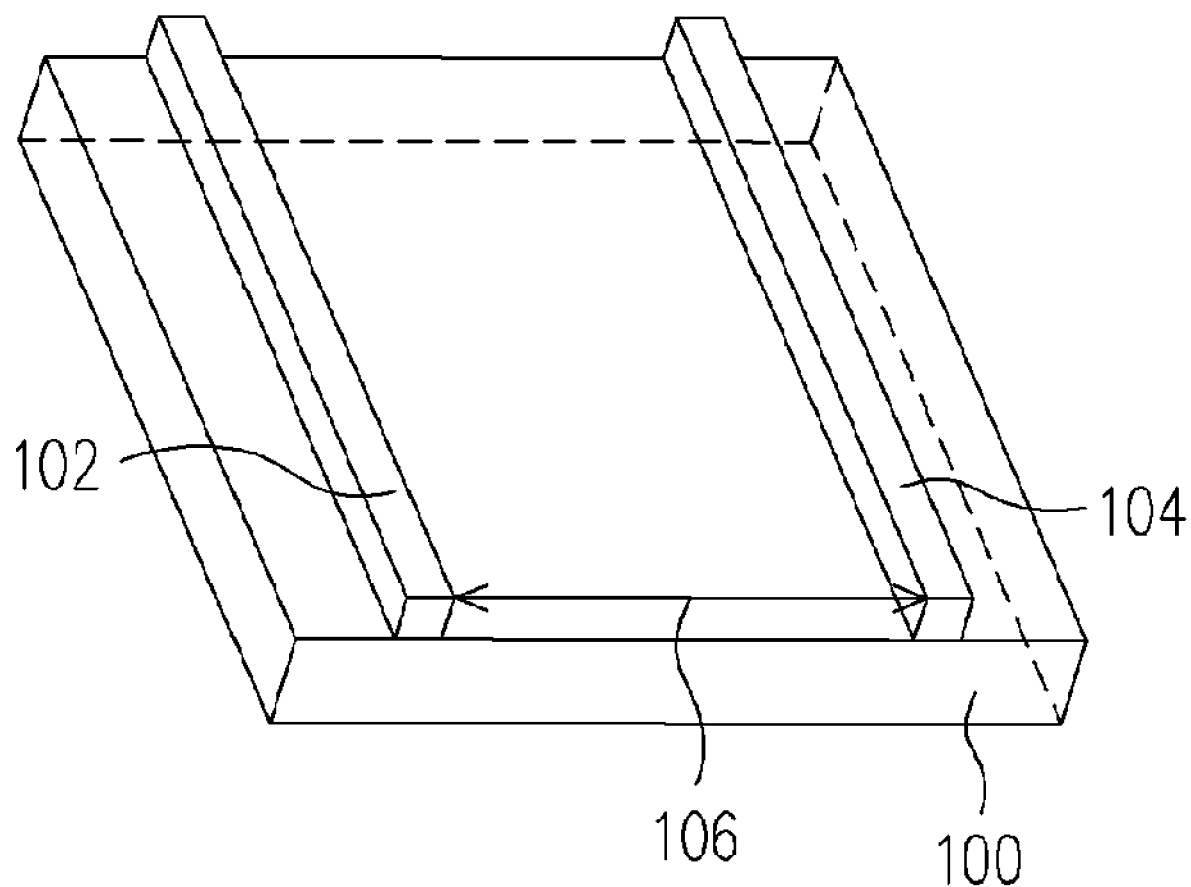
FIG. 1 is a perspective view showing a wafer having two conductive lines thereon waiting to be repaired.

Reference will now be made in detail to the present preferred embodiments of the invention, examples of which are illustrated in the accompanying drawings. Wherever possible, the same reference numbers are used in the drawings and the description to refer to the same or like parts.

In the past, the circuits on a wafer are repaired using the conventional focused ion beam (FIB) technique. However, the FIB technique of wafer circuit repair requires a relatively long repairing period and a high repairing cost. In particular, the repairing time and cost using the conventional FIB technique will be exceedingly high as shown in FIG. 1 if the distance 106 separating the conductive lines 102 and 104 on the wafer 100 is long over hundreds of micrometers.

Figure 2A:
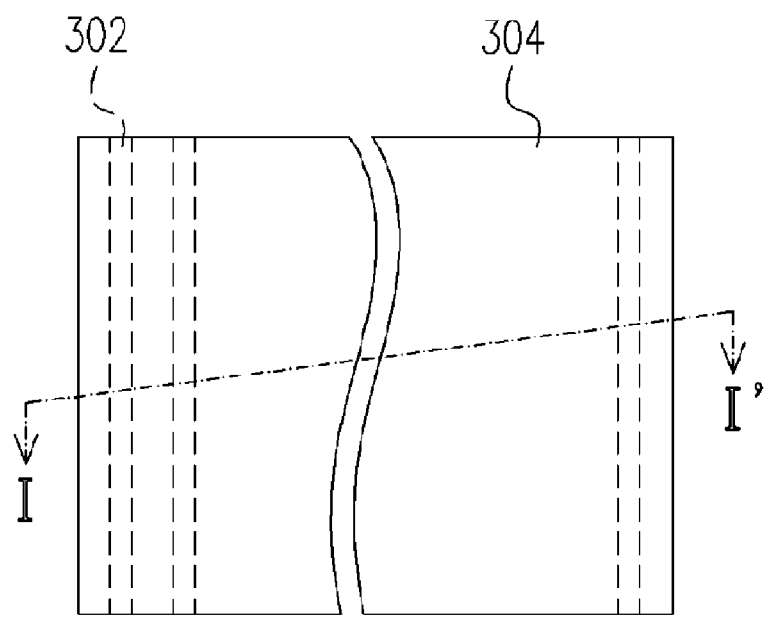
FIGS. 2A through 2F are top views showing the steps for fabricating an interconnection in an insulating layer on a wafer according to one preferred embodiment of the present invention.

FIGS. 2A through 2F are top views showing the steps for fabricating an interconnection in an insulating layer on a wafer according to one preferred embodiment of the present invention. FIGS. 3A through 3F are schematic cross-sectional views along line I-I' of FIGS. 2A through 2F. First, as shown in FIGS. 2A and 3A, a wafer 300 having a plurality of conductive lines 302 thereon is provided. Furthermore, an insulating layer 304 covers all the conductive lines 302. The insulating layer 304 is, for example, a silicon nitride layer or a silicon oxide layer formed in a chemical vapor deposition (CVD) process. In an embodiment, the insulating layer 304 is as a passivation layer for protecting the underlying substrate 300 and the conductive lines 302 against any damage due to foreign impurities and mechanical impact.

Figure 2B:
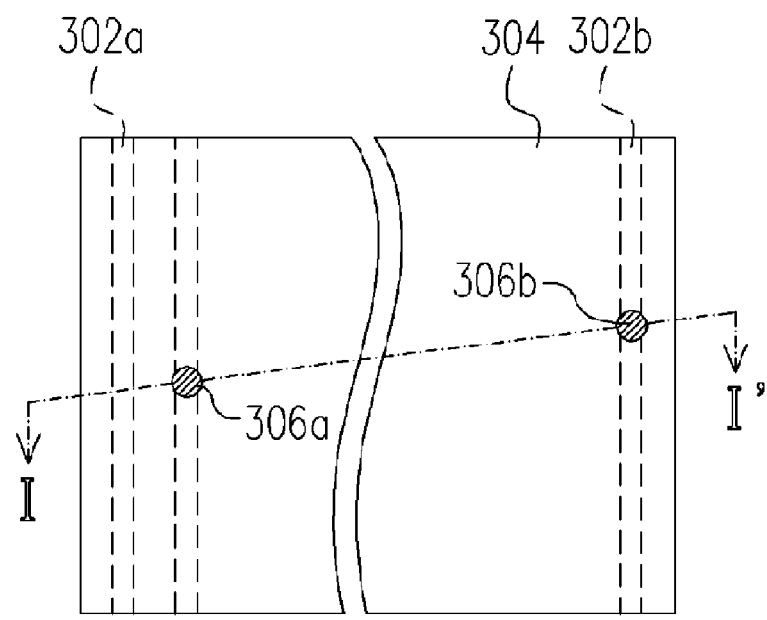
Figure 3A:
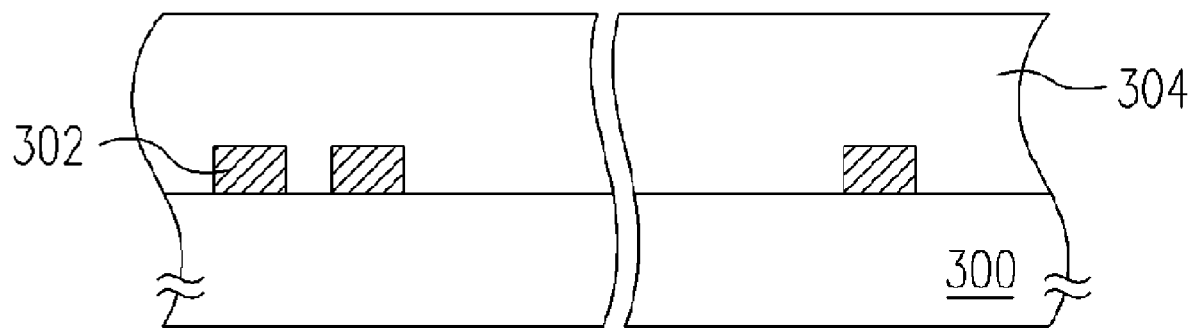
FIGS. 3A through 3F are schematic cross-sectional views along line I-I' of FIGS. 2A through 2F.
Figure 3B:
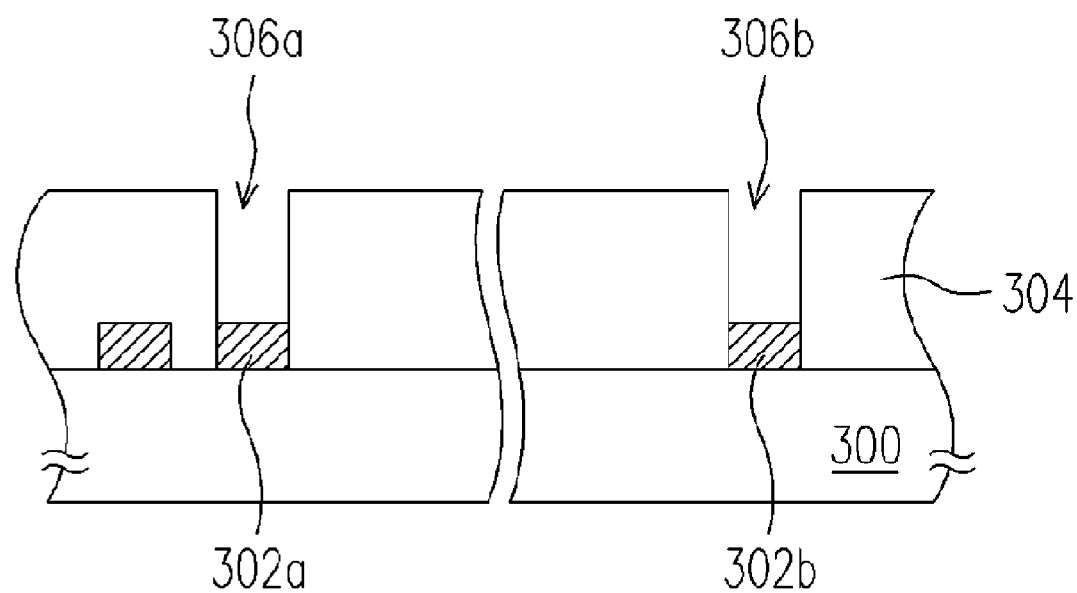

As shown in FIGS. 2B and 3B, two via holes 306a and 306b are formed in the insulating layer 304 to expose two of the conductive lines 302a and 302b. The two via holes 306a and 306b are formed, for example, using a focused ion beam (FIB) or a laser beam.

Figure 2C:
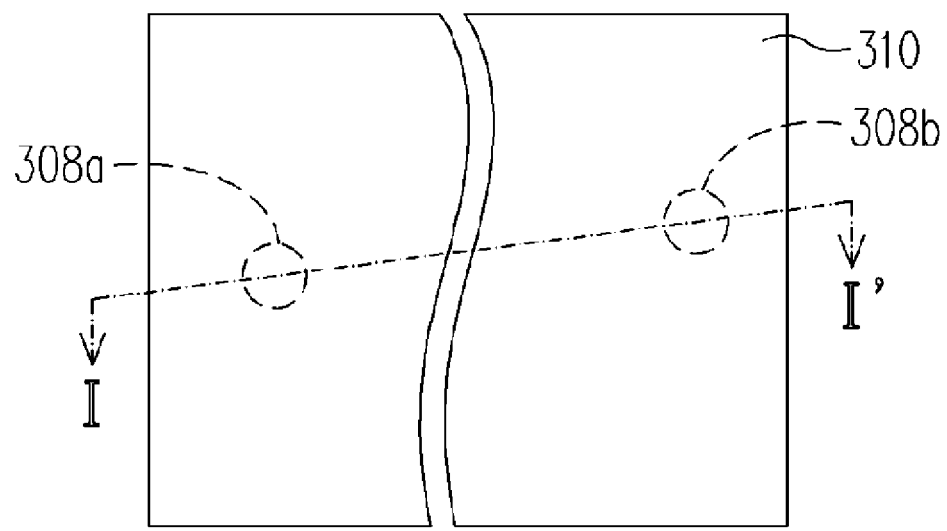
Figure 3C:
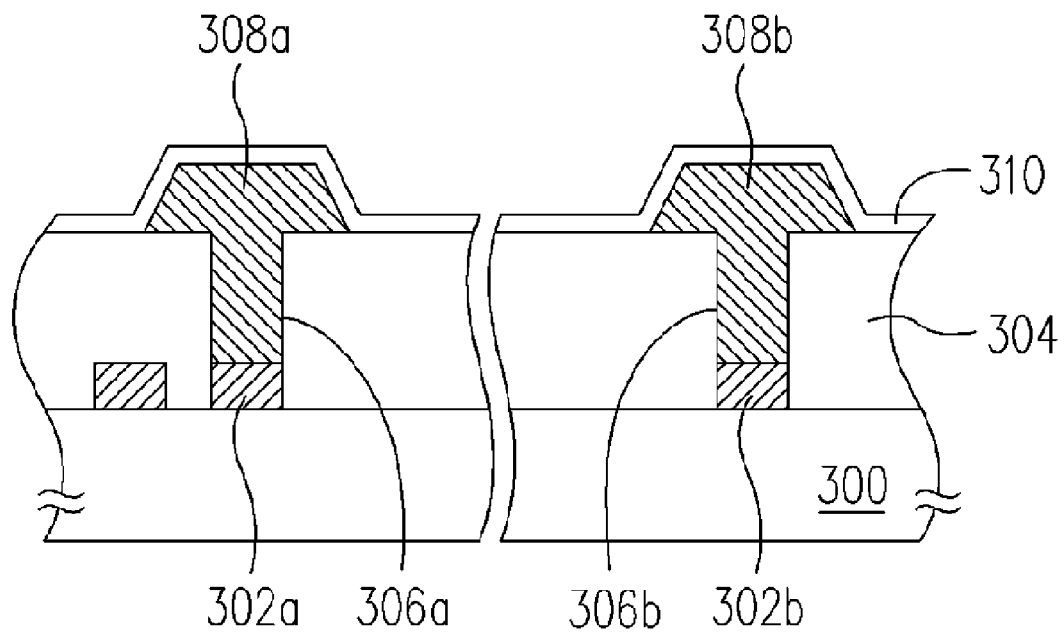

As shown in FIGS. 2C and 3C, a conductive material is deposited into the via holes 306a and 306b to form two pattern marks 308a and 308b. Thereafter, a mask 310 is formed over the wafer 300 to cover the insulating layer 304 and the two pattern marks 310. The conductive layer (the pattern marks 308a and 308b) is selected from a group consisting of tungsten, platinum, gold, copper, aluminum and a combination thereof. The method of forming the conductive layer includes using the focused ion beam (FIB) technique, for example. In one embodiment, the mask layer 310 is a silicon oxide layer formed in a spin coating operation, for example. In another embodiment, the mask layer 310 is a titanium dioxide, acetic acid resin or silicone layer formed by directly disposing the titanium dioxide, the acetic acid resin or the silicone material over the wafer 300 to cover the insulating layer 304 and the pattern marks 308a and 308b.

Figure 2D:
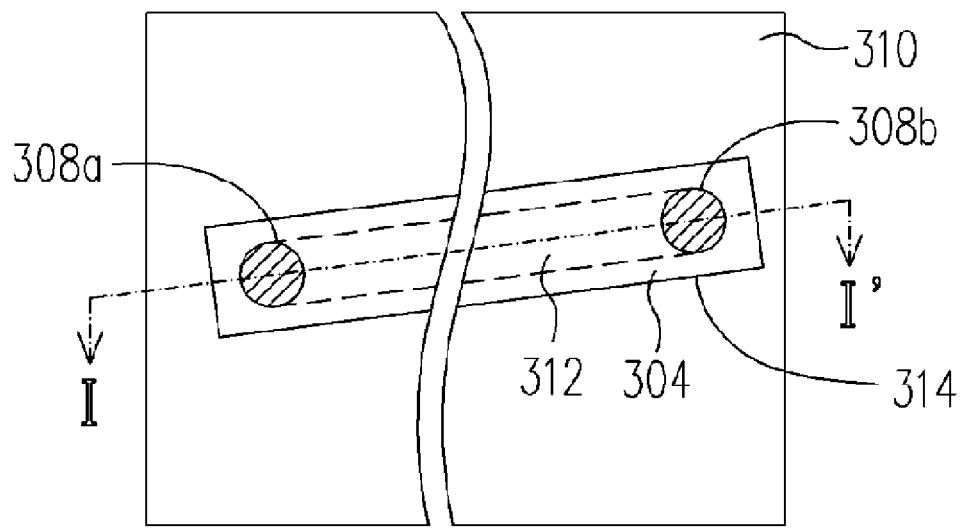
Figure 3D:
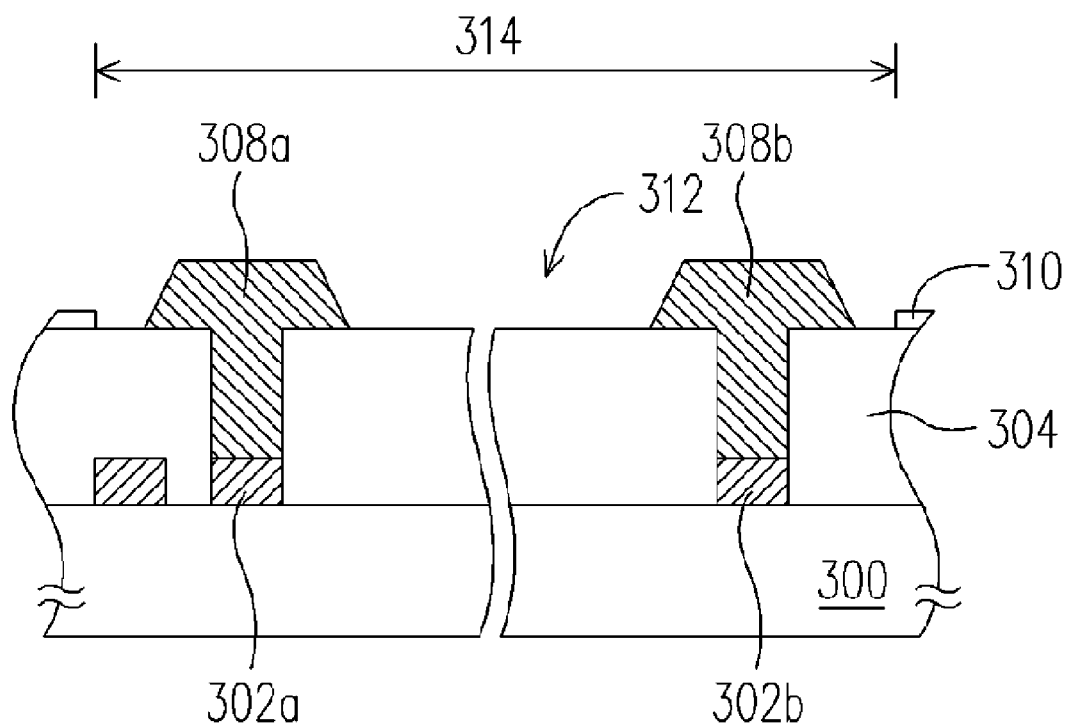

As shown in FIGS. 2D and 3D, the mask layer 310 above and between the two pattern marks 308a and 308b is removed to form a trench 312 that exposes the two pattern masks 308a and 308b and the insulating layer 304 between the two pattern marks 308a and 308b. The process of forming the trench 312 includes cutting out an area 314 on the mask 310 such that the area 314 encloses at least the two pattern marks 308a and 308b and the area between the two pattern marks 308a and 308b. Thereafter, the mask layer 310 within the area 314 is removed. In one embodiment, the method of cutting out the area 314 on the mask 310 includes using a focused ion beam or a laser beam. In another embodiment, if the mask layer 310 is fabricated using titanium dioxide, acetic acid resin or silicone, the method of cutting out the area 314 in the mask 310 includes using a cutting knife, for example.

Figure 2E:
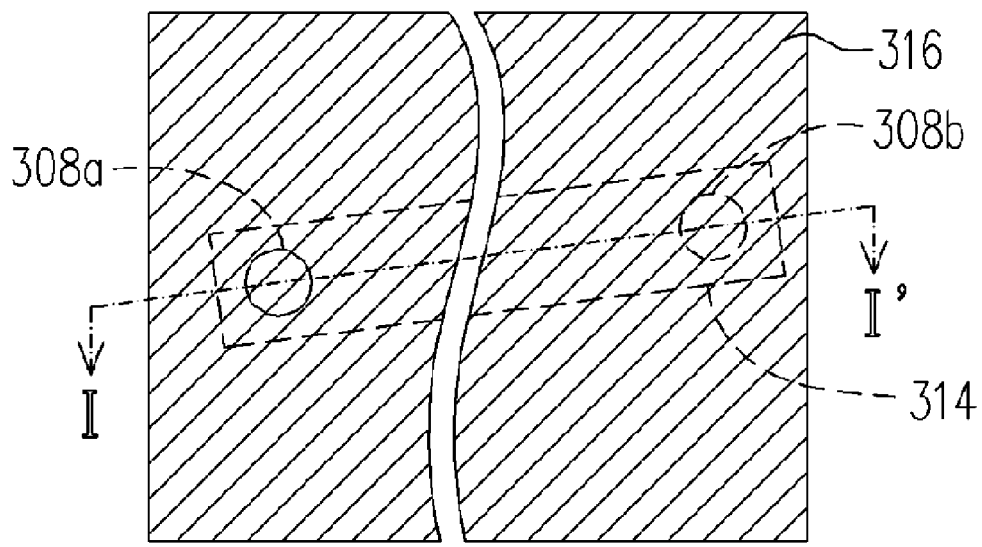
Figure 3E:
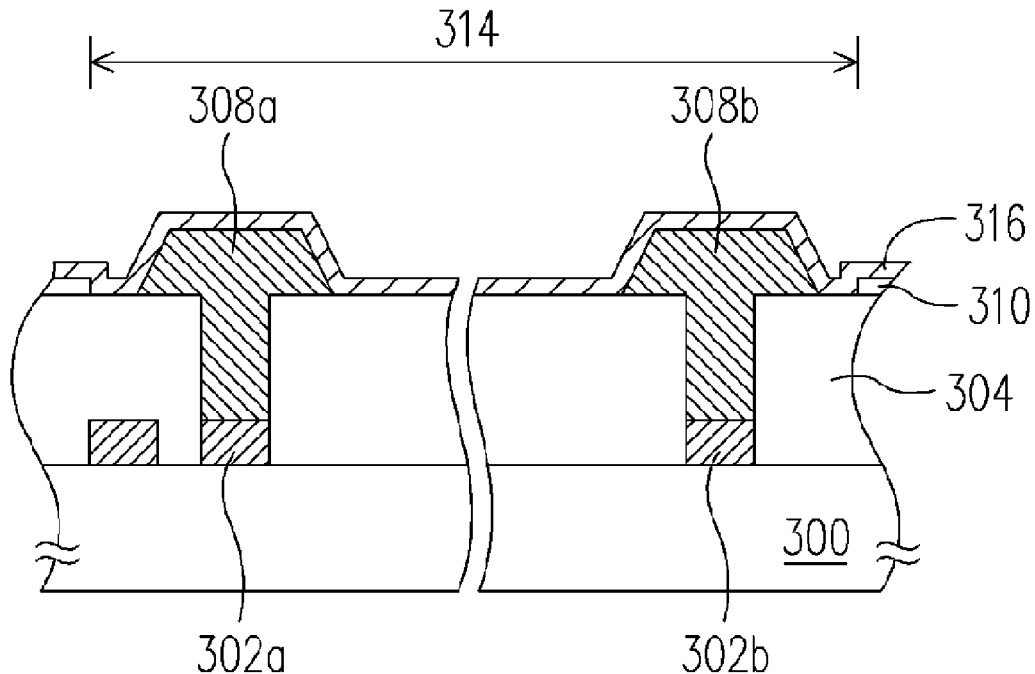

As shown in FIGS. 2E and 3E, a conductive layer 316 is formed over the mask layer 310 to cover the exposed pattern marks 308a and 308b and the insulating layer 304. The conductive layer 316 is selected from a group consisting of tungsten, platinum, gold, copper aluminum and a combination thereof. The conductive layer 316 is formed in a sputtering or an electroplating operation, for example.

Figure 2F:
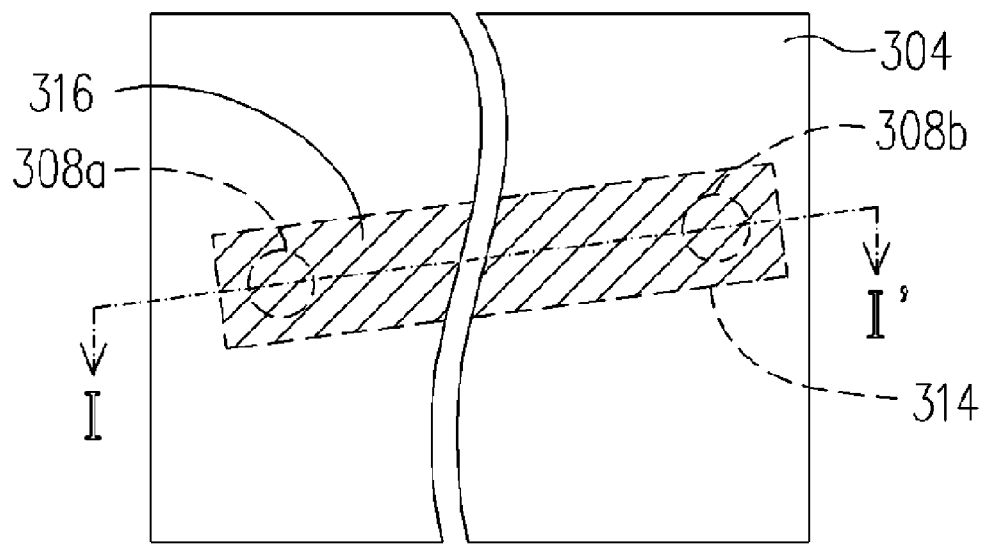
Figure 3F:
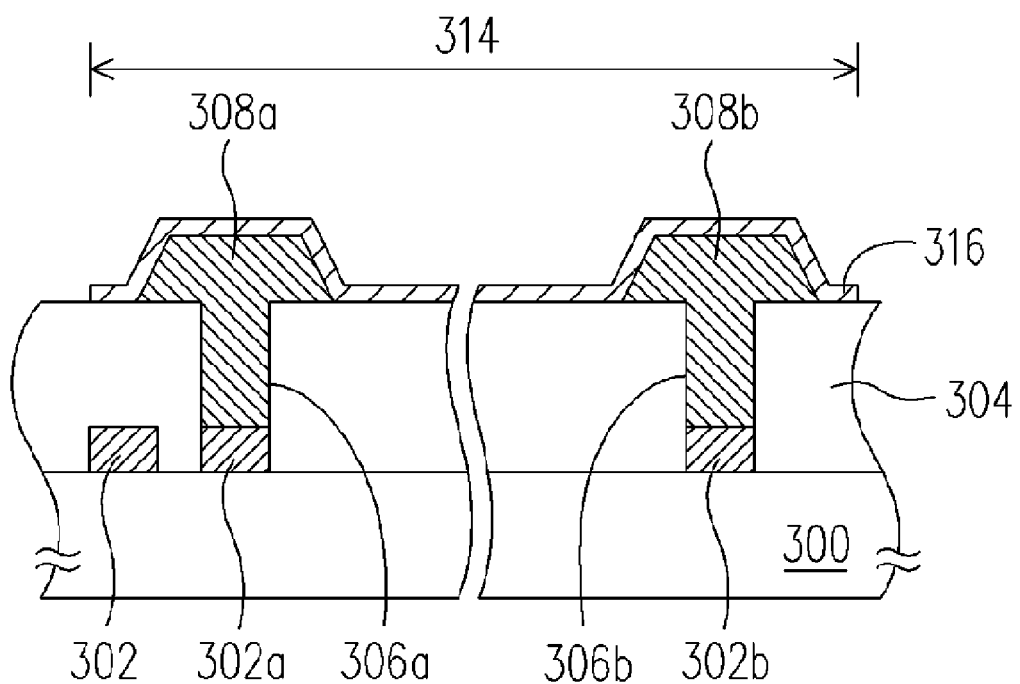

As shown in FIGS. 2F and 3F, the mask layer 310 and the conductive layer 316 above the mask layer 310 are simultaneously removed so that the conductive lines 302a and 302b are electrically connected through the remaining conductive layer 316 and the pattern marks 308a and 308b. Hence, the interconnection in the insulating layer on the wafer is formed.

It should be noted that the aforementioned process is also used for repairing the circuits on a wafer. The conductive lines 302a and 302b in FIG. 2B and FIG. 3B are circuits waiting to be repaired. Thereafter, the interconnection process of the present invention is performed to form an interconnection (the marks 308a, 308b and the conductive layer 316) so that the circuits waiting to be repaired can be electrically connected. The interconnection in an insulating layer on a wafer according to the present invention is illustrated in the following with reference to FIG. 3F. As shown in FIG. 3F, a repaired wafer structure comprises a wafer 300, an insulating layer 304, two pattern marks 308a and 308b and a conductive layer 316. The wafer 300 has a plurality of conductive lines 302 thereon. Furthermore, the insulating layer 304 is disposed on the wafer 300 to cover the conductive lines 302. The insulating layer 304 has two via holes 306a and 306b that expose two of the conductive lines 302a and 302b. The two pattern marks 302a and 302b are disposed inside the via holes 306a and 306b and in electrical contact with the conductive lines 302a and 302b respectively. The top surface of the two pattern marks 308a and 308b is higher than the top surface of the insulating layer 304. The conductive layer 316 covers at least the surface of the two pattern marks 308a and 308b and the insulating layer 304 between the two pattern marks 308a and 308b so that the two conductive lines 302a and 302b are electrically connected.

In the present invention, two pattern marks 308a and 308b are formed over the two conductive lines 302a and 302b and made electrical contact with the two conductive lines 302a and 302b. Thereafter, the conductive layer 316 is formed over the two pattern marks 308a and 308b so that the two conductive lines 302a and 302b are electrically connected through the conductive layer 316, thereby repairing the two of the circuits. If the two conductive lines 302a, 302b are circuits waiting to be repaired, the method of the present invention is also applied to repair circuits so that the circuits waiting to be repaired can be electrically connected.

In summary, the method for fabricating an interconnection in an insulating layer on a wafer according to the present invention does not used a focused ion beam to form an interconnection in an insulating layer. Since the FIB technique of forming an interconnection or wafer circuit repair requires a relatively long repairing period and a high repairing cost especially when the distance separating the conductive lines to be repaired is more than hundreds of micrometers long, the present invention can save considerable production time and cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an interconnection in an insulating layer on a wafer, comprising the steps of:
   providing a wafer having a plurality of conductive lines thereon, wherein an insulating layer covers the conductive lines;
   forming two via holes in the insulating layer to expose two of the conductive lines;
   filling the via holes with a first conductive material to form two pattern marks;
   forming a mask over the wafer to cover the insulating layer and the pattern marks;
   removing the mask above and between the two pattern marks to form a trench that exposes the pattern marks and the insulating layer;
   forming a second conductive layer over the mask layer to cover the exposed pattern marks and the insulating layer; and
   removing the mask and the second conductive layer above the mask simultaneously.

2. The method of claim 1, wherein the material constituting the mask comprises silicon oxide.

3. The method of claim 2, wherein the step of forming die silicon oxide mask over the wafer comprises performing a spin coating operation.

4. The method of claim 1, wherein the material constituting the mask comprises titanium dioxide, acetic acid resin or silicone.

5. The method of claim 1, wherein the step of removing the mask above and between the pattern marks to form a trench comprises:
   cutting out an area in the mask; and
   removing the mask within the cutout area.

6. The method of claim 5, wherein the step of cutting out an area in the mask comprises cutting with a focused ion beam (FIB) or a laser beam.

7. The method of claim 1, wherein the material constituting the first conductive layer is selected from a group consisting of tungsten, platinum, gold, copper, aluminum and a combination thereof.

8. The method of claim 1, wherein the via holes are formed in the insulating layer by a focused ion beam or a laser beam.

9. The method of claim 1, wherein the step of filling the via holes with a first conductive material comprises applying a focused ion beam.

10. The method of claim 1, wherein the material constituting the second conductive layer is selected from a group comprising tungsten, platinum, gold, copper, aluminum and a combination thereof.

11. The method of claim 1, wherein the step of forming the second conductive layer comprises performing a sputtering or an electroplating operation.

12. The method of claim 1, wherein the insulating layer is a passivation layer.

13. The method of claim 1, wherein the material constituting the insulating layer comprises silicon nitride or silicon oxide.

* * * * *